United States Patent [19]
Zocholl

[11] Patent Number: 4,914,386
[45] Date of Patent: Apr. 3, 1990

[54] METHOD AND APPARATUS FOR PROVIDING THERMAL PROTECTION FOR LARGE MOTORS BASED ON ACCURATE CALCULATIONS OF SLIP DEPENDENT ROTOR RESISTANCE

[75] Inventor: Stanley E. Zocholl, Holland, Pa.

[73] Assignee: ABB Power Distribution Inc., Purchase, N.Y.

[21] Appl. No.: 187,317

[22] Filed: Apr. 28, 1988

[51] Int. Cl.⁴ .......................... G01R 27/00; H02P 5/40
[52] U.S. Cl. ............................ 324/158 MG; 318/490
[58] Field of Search ...................... 324/158 MG, 545; 318/490, 696, 803, 808, 805; 364/482, 483, 497, 550; 340/648

[56] References Cited

U.S. PATENT DOCUMENTS

| | | | |
|---|---|---|---|
| 2,568,406 | 9/1951 | Packer et al. | 324/158 MG |
| 2,640,100 | 5/1953 | Packer et al. | 324/158 MG |
| 4,413,325 | 11/1983 | Elfner et al. | 340/648 |
| 4,441,065 | 4/1984 | Bayer et al. | 324/158 MG X |
| 4,442,393 | 4/1984 | Abbondanti | 324/158 MG X |
| 4,525,763 | 6/1985 | Hardy et al. | 324/158 MG X |
| 4,670,698 | 6/1987 | Fulton et al. | 324/158 MG X |

FOREIGN PATENT DOCUMENTS 0101773 3/1984 European Pat. Off. .

OTHER PUBLICATIONS

Deshpande et al.; "A New Method of Determining Rotor Leakage Reactance and Resistance of a Three Phase Induction Motor"; The Institution of Electrical Engineers; paper #2757u; Feb. 1959; pp. 46–50.

Primary Examiner—Reinhard J. Eisenzopf
Assistant Examiner—Vinh P. Nguyen
Attorney, Agent, or Firm—Ostrolenk, Faber, Gerb & Soffen

[57] ABSTRACT

A microprocessorized thermal protection system and accompanying method measures input voltage and current of an induction motor and derives therefrom continuously updated estimates of the slip dependent rotor resistance during acceleration of the motor. The measurements and calculations of the varying rotor resistance enable determination of the heat generated within the motor based on a thermal model thereof. Phase shift distortions induced by the measurement system are accounted for by determining the value of the stator resistance at start up. In addition, during a brief period following start up, sampling of the voltage/current inputs is suspended to avoid the effects of the initially occurring DC-offset resulting from the application of the voltage input to the inductive motor load.

17 Claims, 5 Drawing Sheets

METHOD AND APPARATUS FOR PROVIDING THERMAL PROTECTION FOR LARGE MOTORS BASED ON ACCURATE CALCULATIONS OF SLIP DEPENDENT ROTOR RESISTANCE

BACKGROUND OF THE INVENTION

The present invention relates to a method and apparatus for the safe starting of a large induction motor and more particularly to a method and apparatus capable of accurately calculating the varying, slip dependent, rotor resistance of a motor by means of a microprocessor based measurement system.

Electric motors generate heat and require protection from overheating. The need for thermal protection is particularly acute in large motors, for example induction motors of several thousand horse power which are quite expensive and difficult and time consuming to repair.

Motors are designed to withstand internally generated heat arising from currents at rated loads. But the starting or restarting of a large induction motor or a locked rotor condition in an induction motor requires special attention since, in all of the above mentioned cases, the current flowing in the motor is significantly higher than rated load current. Since heat is generated in proportion to the square of the current, the motor can be damaged from overheating within a matter of seconds. Motors are, therefore, provided with so called relay protection devices for tripping the motor before it reaches a damaging temperature. Usually, the motor is tripped at a predetermined time following the detection of the locked rotor condition or after starting if the current or speed of the motor has not reached its operational level within a prescribed time period.

The locked rotor condition does not present a particularly difficult problem because the locked rotor current is relatively constant and so is the resistance of the rotor winding during a locked rotor condition. It is therefore a simple matter to calculate and integrate the $I^2R$ heating effect in the motor and to trip the motor before it reaches its critical temperature.

But calculating the heating effect resulting from starting current is not as simple. The magnitude of the starting current is about equal to the locked rotor current but has a lesser heating effect. This is because the effective resistance of the rotor winding changes with slip. The rotor resistance has a high initial value at start up, when the rotor is effectively locked and the slip is by definition unity, and a final rotor resistance value which may be as little as one third of the initial resistance as the motor reaches its rated slip. The same is therefore true of the $I^2R$ heating effect. Unfortunately, conventional protection systems respond only to the current or to speed of the motor and assume that the resistance of the rotor remains at its initial high value throughout the starting cycle.

Very large motors have larger torque and/or moment of inertia and a proportionally increased motor starting time. The starting/acceleration period of induction motors with high inertia drives approaches and may in fact exceed the time interval at the conclusion of which the motor is normally tripped by the locked rotor protection mechanism.

Several conventional protection schemes are available for dealing with the problem but they are exceedingly complex. Other simpler conventional schemes resort to the use of a so-called "under impedance relay" which defeats the locked rotor protection mechanism during the later phase of a starting cycle to permit the motor to start. It is frustrating to realize that an under impedance relay must be used to terminate protection at the point where it is needed, solely because of an apparent inability to determine the profile of the rotor resistance throughout the starting sequence.

SUMMARY OF THE INVENTION

It is an object of the present invention to provide a method and apparatus for dynamically and accurately estimating the heat being generated in an induction motor, practically throughout the starting cycle of an induction motor.

It is a further object of the invention to provide a method and apparatus for safely starting a large induction motor by means of an advanced microprocessor based motor protection system.

It is yet another object of the present invention to provide an advanced microprocessor based motor protection system which is responsive to a motor's terminal voltage and current inputs to derive therefrom accurate estimates of the motor's slipdependent rotor resistance.

The foregoing and other objects of the invention are realized by means of a microprocessor based thermal protection system having a microprocessor or the like, a novel control program, and an interface circuit for interfacing the microprocessor to a motor. The voltages/currents applied to the motor are sensed and sampled by the interface circuit and converted into a series of sampled signals, preferably digital signals, suitable for being processed in the microprocessor.

Preferably, the interface circuit includes a plurality of voltage and current transformers (VT's and CT's) coupled to the voltage/current input lines of the motor and anti-aliasing filters (LPF) for filtering the output signals delivered by the transformers. The filtered outputs are then directed through a series circuit which comprises: a first set of sample/hold (S/H) elements which sample the output signals of the filters (LPF), a multiplexer (MUX) which individually and sequentially selects the sampled signals and presents them to a programmable gain amplifier (PGA), a second sample/hold circuit (S/H) for sampling the output of the PGA and an analog digital converter (ADC) for converting said output to digital quantities.

At least two and preferably four or more samples of the motor's input voltage/current are taken by the first S/H per cycle. The microprocessor receives and uses the stream of voltage and current samples and derives from them continuously updated estimates of the rotor resistance and temperature by employing the below described novel algorithm.

The ability of the present invention to provide fairly accurate temperature estimates hinges on its ability to determine the varying slip and hence rotor resistance of the motor, practically throughout and beyond the starting/acceleration phase of the induction motor, as explained below.

The art is familiar with two important equations which relate: the slip, the rotor resistance, the stator resistance, the total apparent resistance looking into the motor terminals and certain motor related constants, to one another. The equations are:

$$S = R_0 / [A(R - R_3) - (R_1 - R_0)] \quad \text{(A)}$$

$$R_4 = (R_1 - R_0)S + R_0 \quad \text{(B)}$$

The first equation (A) is the slip equation which expresses motor slip in terms of the total apparent resistance R looking into the motor terminals, the stator resistance $R_3$, and a set of constants ($R_0$, $R_1$ and A) which are given by or derivable from application data supplied by the manufacturer. The second equation (B) yields the value of rotor resistance $R_4$ from the slip S and the constants $R_0$ and $R_1$.

The total apparent resistance R in equation (A) may be obtained by measuring (sampling) the input voltage and current signals at the motor. It is possible, by means of a microprocessor and a digital filtering scheme, to convert the three phase voltage/current analog signals of a motor to digital quantities which represent the rectangular form of each individual phasor. The process is described by R. Iyer and C. Downs in an article entitled "New Microprocessor Based Distribution Feeder Protection System", Twelfth annual Western Protective Relay Conference, Spokane, Wash., October 1985.

In principle, the value of the stator resistance $R_3$ appearing in the slip equation (A) is known from manufacturer data. It should have been a simple matter to solve for slip S by measuring the motor's voltages/currents, calculating R and substituting the value of R in the slip equation (A). But in practice that is not workable for the following reason.

Measurement of the total resistance value R and, hence, estimates of slip, rotor resistance and temperature, are significantly affected by the phase relationship between the voltages and currents impressed on the motor. Unavoidably, the voltage/current measuring circuit introduces unwanted phase shifts which skew the total resistance measurements (R) and result in unreliable estimates of slip S, rotor resistance $R_4$ and hence motor temperature.

The present invention overcomes the above problem by recognizing that at start up, when the motor is first energized, the motor slip is by definition at unity. The invention, therefore, proceeds by taking a first sample and determining the total resistance R at start up and by preliminarily solving the slip equation (A) to obtain therefrom a "calculated" stator resistance $R_3$ which is derived at start up from the first sample of R when S=1. Thereafter, only the "calculated" stator resistance $R_3$ is used in the first equation (A) to obtain repetitively updated values of slip S based on the calculated $R_3$ and subsequent measurements of the total resistance R. Since motor slip S depends on the difference between the total resistance R and the stator resistance $R_3$, the effect of phase shift is minimized if not entirely cancelled and consequently the slip equation provides accurate estimates of the instantaneous slip of the motor, throughout the starting sequence and beyond.

The rapidly updated slip values are dynamically substituted in the second equation (B) to obtain reliable estimates of the instantaneous rotor resistance $R_4$ and, ultimately, the heating effect and temperature.

The method of the present invention is refined by the realization that the analog waveforms of the motor experience a DC-offset as a result of the application of the input voltage to the highly inductive circuit of the motor at start up. The DC-offset distorts the current waveforms, resulting in inaccurate voltage/current measurements. It has been found, however, that the offset current decays exponentially such that its effect is gone within about 0.05 seconds or 3½ cycles of the applied power. The method of the present invention therefore further involves suspending the calculations of slip and rotor resistance during this initial interval. In that interval, the heat calculations are carried out using the manufacturer specified locked rotor current and rotor resistance data, with hardly any loss in accuracy.

Thus, the present invention succeeds in calculating, in real time and reliably, the rotor resistance as a function of slip throughout the starting cycle of an induction motor by means of a microprocessor based system which is relatively structurally simple and sufficiently sophisticated to permit the system to handle virtually any induction motor and to adapt to many different environments.

Other features and advantages of the present invention will become apparent from the following description of the invention as set forth below by reference to the following drawings.

DETAILED DESCRIPTION

Introduction

The present invention is concerned with providing improved thermal protection for large induction motors under critical conditions of high inertia starting, restarting, a locked rotor or an overload condition. The protection scheme of the present invention is based on an algorithm that produces accurate estimates of the rotor and stator temperatures of the motor and includes means for tripping the motor before it reaches its critical temperature. While the prior art provides adequate systems for dealing with locked rotor currents and temperatures, its protection scheme for handling starting of large induction motors suffers from the disadvantages described below.

Conventional locked rotor protection is provided by so-called protection relay circuits which respond to the relatively constant locked rotor current and act to trip the motor timely to prevent thermal damage.

Figure 1:
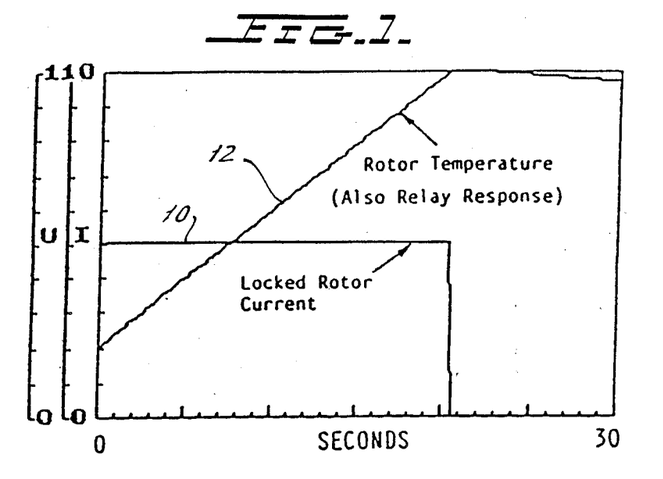
FIG. 1 is a plot, on log paper, of the rotor temperature and locked rotor current versus time, for the locked rotor case.
Figure 3:
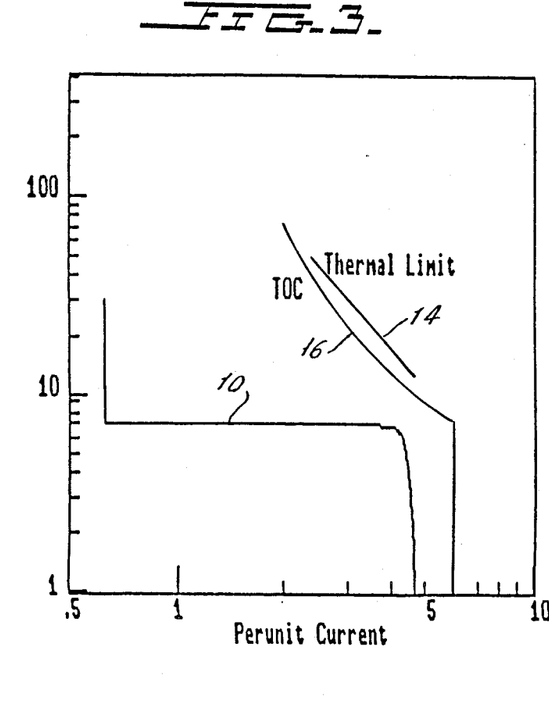
FIG. 3 plots the current and thermal limit curve for the coordination of locked rotor current with thermal protection.

As seen in FIGS. 1 and 3, the locked rotor current waveform 10 has a relatively constant magnitude. Similarly, it is known that the rotor resistance of an induction motor is relatively constant during a locked rotor condition, its exact value being available from the manufacturer's specifications for the given motor. Consequently heat is generated in the motor at the constant rate of $I^2R$, where I represents the locked rotor current and R the rotor resistance. Under these conditions, the temperature in the motor rises linearly along the curve 12 as plotted on the log paper of FIG. 1. The relationship of the temperature curve 12 to the heating effect $I^2R$ and other parameters is described in the literature.

As illustrated in FIG. 3, conventional locked rotor protection schemes respond to the current ×time product and trip the motor at the thermal overcurrent (TOC) curve 16 to avoid reaching the absolute thermal limit curve 14. In the example of FIG. 1 which is provided in relation to a large induction motor of about 6,000 HP, tripping of the motor occurs at about 20-25 seconds after inception of the locked rotor condition. Note the reversal in the slope polarity of temperature curve 12 after tripping.

Figure 2:
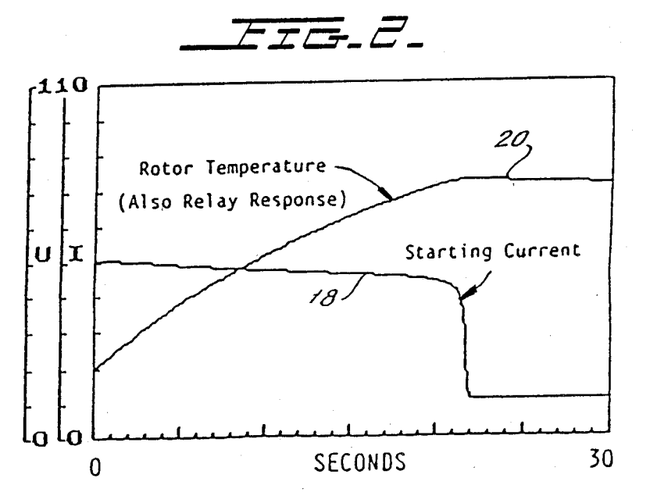
FIG. 2 is a plot of the rotor temperature and starting current versus time, for a normal starting sequence of a large induction motor.
Figure 4:
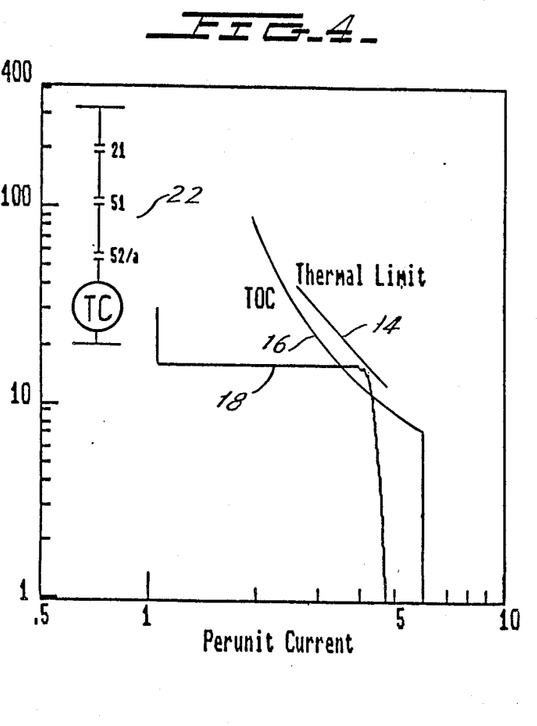
FIG. 4 is a plot of the thermal limit and current waveform, illustrating the apparent problem of starting a high inertia motor.

The problem arising from attempting to apply the locked rotor thermal protection scheme to a normal starting of a motor is apparent from FIGS. 2 and 4. The magnitude of the starting current 18 is not appreciably different from the locked rotor current 10. But the starting current 18 produces a lesser heating effect as is evident from the motor starting temperature curve 20. Unlike the locked rotor case where motor slip remains at unity and the rotor resistance is therefore constant, the rotor resistance magnitude changes with slip during a normal starting sequence, from a high initial value when slip is at unity to as little as a third of that value at rated-slip. Obviously, the $I^2R$ heating effect decreases proportionally. The varying rotor resistance is due to the skin effect of the slip frequency which gradually reduces the rotor resistance and therefore the heat input during the acceleration, i.e. starting process.

The starting time of certain high inertia motors is comparable to the interval a the conclusion of which such motors would be tripped if they were experiencing a locked rotor condition, as shown in FIG. 4. Consequently, application of the conventional locked rotor protection scheme to the starting case results in premature and unnecessary tripping of the motor.

The prior art has responded to the problem by noting that the rotor resistance can be derived from manufacturer supplied current and torque versus speed curves and relied upon for effecting thermal protection during motor acceleration/starting. Since these curves define the current and torque for every value of slip, perunit rotor resistance can be calculated using the equation for torque Q in terms of current resistance and slip: $Q=I^2R/S$. Thus, $R=(Q/I^2)S$ and the calculations carried out for data for a 6,000 HP motor results in a linear resistance curve versus slip as depicted in FIG. 6b.

Reliance on the above scheme requires measurement of motor speed to prevent overcurrent tripping when acceleration is detected. The conventional practice has been to provide an under impedance relay 22 (FIG. 4) whose contacts are arranged as shown in the inset of the Figure. The relay is set to pick up on the high initial impedance and to open its contacts at the low impedance corresponding to a predetermined speed. This prevents tripping by the locked rotor overcurrent relay which times out without tripping the motor.

The prior art solution to the problem of high inertia motor starting requires considerably more application data, since the impedance versus slip must be calculated from current and power factor versus slip curves for the specific motor. It is a difficult application because the relay must detect a small variation in impedance, early in the acceleration cycle. This is where the rate of change of impedance is very small and the impedance changes very slowly through the balance point. Relay testing is also more critical and complex, requiring a voltage and current source with phase and magnitude control.

The Invention

The present invention is based on an advanced microprocessor based motor protection relay having a capability to monitor the motor's currents and voltages at the input terminals of the motor and to derive therefrom continuously updated and fairly accurate estimates of the slip dependent rotor resistance of the motor. The invention therefore responds to the slip dependent $I^2R$ heating effect, rather than just to current, and implicates minimal application data. The invention produces, from the rotor resistance profile and with the aid of a rotor thermal model, reasonably accurate estimates of rotor temperature and consequently a more precisely tuned tripping response.

As will be shown below, rotor resistance depends directly on slip and the success of the invention depends on its ability to determine the slip, virtually throughout the acceleration phase of the motor. Conventional techniques could not account for varying slip, which is a prerequisite for determining the quantity of heat generated in the rotor. However, the microprocessor based system of the present invention operates in conjunction with either an external or an internally implemented digital filter to convert the three phase analog voltage and current signals of a motor to digital quantities which quantities it resolves into their rectangular components. The real time computing power of the microprocessor is used for calculating so-called "positive sequence" parameters of the motor from which slip, rotor resistance, and heating effect can be determined.

Figure 7:
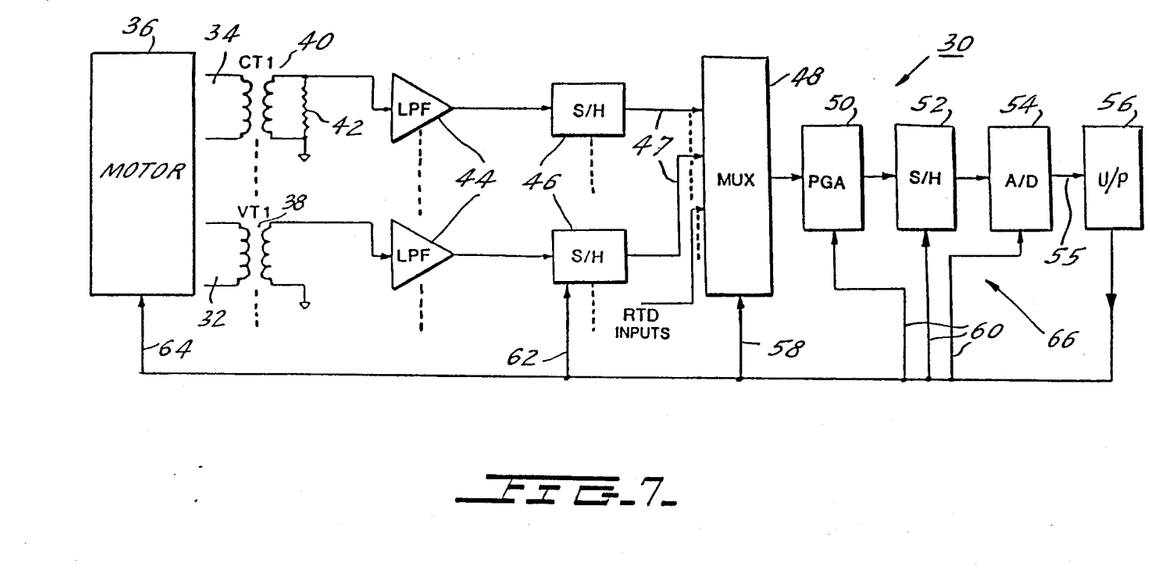
FIG. 7 is a block diagram of a microprocessorized protection relay for a motor.
Figure 8:
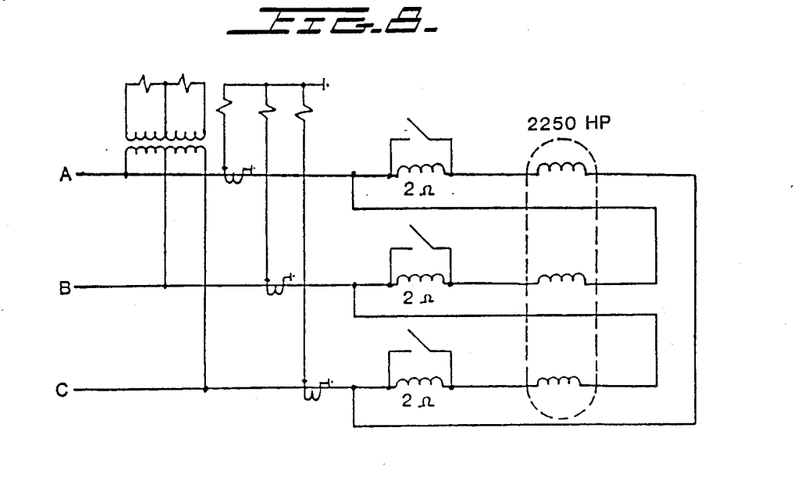
FIG. 8 illustrates the manner of interconnecting a microprocessor based motor protection system to a motor.

The microprocessor protection system 30 depicted in FIG. 7 includes an interface circuit 66 and an associated microprocessor 56. Each phase of the voltage 32 and current 34 of motor 36 is connected to a respective input voltage transformer (VT1) 38 and a current transformer (CT1) 40, the current transformer 40 having a resistive burden 42. One mode of interconnecting the voltage and current transformers to the motor 36 is shown in FIG. 8.

The outputs of voltage and current transformer 38 and 42 are filtered in anti-aliasing filters (LPF) 44 to remove unwanted high frequency components and these outputs are further directed to six sample and hold amplifiers (S/H) 46 which sample, preferably simultaneously, the three phase voltages and currents. Analog multiplexer (MUX) 48 receives the outputs of the sample and hold amplifiers (S/H) 46 and, under control of microprocessor 56 via lines 58, sequentially selects and passes the sampled three phase voltage/current signals to the programmable gain amplifier (PGA) 50. A second sample and hold amplifier (S/H) 52 scales the output signals 47 and the analog to digital converter (ADC) 54 converts them to digital quantities representative of the sampled analog signals 47, preferably in the form of digital words, for example, 12 bit digital words. The digital quantities are then supplied, via lines 55, to microprocessor 56 for enabling microprocessor 56 to repetitively calculate instantaneous slip and rotor resistance values and to derive estimates of motor temperature as explained hereinafter on. Control lines 60, 62, and 64 enable microprocessor 56 to exercise overall control over the interface circuit 66 which circuit interfaces motor 36 to microprocessor 56 and permits the motor 36 to be tripped, if necessary, by a signal transmitted along lines 64. The aforementioned control lines have been implemented in an actual embodiment of the invention by means of a bus system whereby the data/control bus lines of microprocessor 56 are routed to the devices of interface circuit 66 and/or motor 36.

Figure 6A:
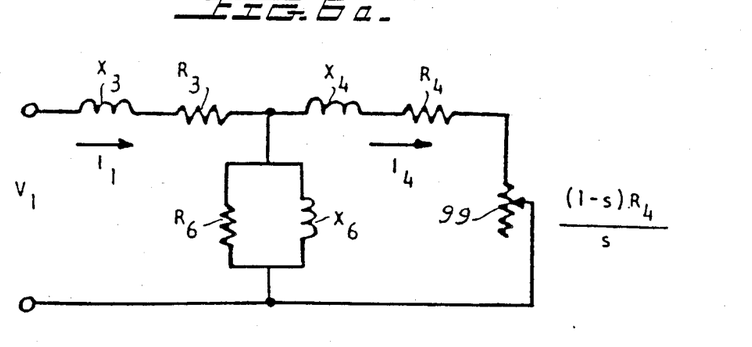
FIG. 6a is an electrical model of the rotor of an induction motor.
Figure 6B:
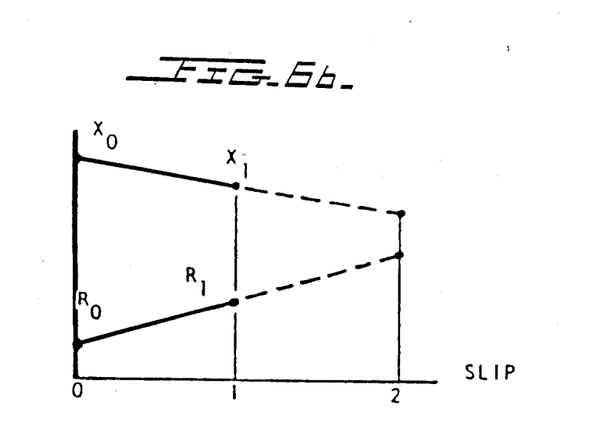
FIG. 6b plots the relationship of rotor resistance to slip.

FIGS. 6a and 6b represent, respectively, an electrical model of the rotor of the induction motor 36 and a linear plot of the rotor resistance and reactance versus slip. These Figures and a below described set of associated equations will serve to explain he algorithm that enables the present invention to derive instantaneous slip estimates from measurements of the motor's voltage/current inputs.

The symbols in FIG. 6a are defined below as follows:
$V_1$: is the positive-sequence terminal voltage;
$I_1$: is the positive-sequence input current;
$I_4$: is the positive-sequence rotor current;
$R_3 + jX_3$: is the stator impedance;
$R_4 + jX_4$: is the positive-sequence rotor impedance (slip dependent);
S: is the perunit slip;
$X_6$: is the magnetizing reactance;
$R_6$: is the non-linear resistance representing core losses.

The power delivered to the variable resistor 99 in FIG. 6a represents the electromechanical power developed by the induction motor. The other resistors $R_3$, $R_4$, $\overline{R_6}$ represent the heat sources and are of particular concern to the present invention.

As shown in FIG. 6b and explained by the literature cited further on, the rotor resistance and reactance are slip dependent and approximately linear. In the Figure:
$X_1$ = rotor reactance at S = 1
$X_0$ = rotor reactance at S = 0
$R_1$ = rotor resistance at S = 1
$R_0$ = rotor resistance at S = 0
It follows from FIG. 6b that:

$$R_4 = (R_1 - R_0)S + R_0$$

$$X_4 = (X_1 - X_0)S + X_0$$

As more fully developed in: (1) "Thermal Protection of Inductor Motors Enhanced by Interactive Electrical and Thermal Models" by Stanley E. Zocholl, et al., IEEE Power Engineering Review, February 1985, and (2) "Thermal Protection of Inductor Motors Enhanced by Interactive Electrical and Thermal Models", Stanley E. Zocholl, et al., IEEE Transactions Vol. PAS-103, No. 7, July 1984, pp. 1749–1756, a good approximation of the current $I_4$ is obtained by assuming that $R_4$ divided by the slip is small compared to $X_6$ (this is the usual case) so that $I_4 = I_1/A$ where $A = (X_4 + X_6)/X_6$.

In FIG. 6a, the magnitudes of the terminal voltage and current $V_1$ and $I_1$ can be measured, for example, by means of the microprocessor protection system 30 of FIG. 7. Further, let $$Z = R + jX = V_1/I_1$$

be the "apparent positive-sequence impedance" seen looking into the induction motor 36. This impedance must equal that obtained from analyzing the circuit model of FIG. 6a. That is, $$Z = R + jX = R_3 + jX_3 + (R_4/S + jX_4)/A$$

with $A = (X_4/X_6)/X_6$, as before. Taking only the real part of the foregoing equation obtains:

$$R = R_3 + R_4/(A \cdot S)$$

Substituting the linear equation for $R_4$ in terms of slip in the above equation and solving for slip results in:

$$S = R_0/[A(R - R_3) - (R_1 - R_0)]$$

The quantities $R_0$, $R_1$ and A have been defined and their values are typically supplied with or derivable from the application data of the given induction motor.

The second one of the aforementioned articles by Stanley E. Zocholl, et al. shows that R, the positive sequence impedance, of the motor 36 is given by:

$$R = (|V_{a1}|/|I_{a1}|)\cos\theta = (V_{a1x}I_{a1x} + V_{a1y}I_{a1y})/|I_{a1}|^2$$

where $V_{a1}$ and $I_{a1}$ denote positive sequence voltage and current, respectively, and the subscripts x and y denote the real and imaginary components of these quantities. One of the practical difficulties in measuring the apparent positive-sequence impedance arises from the necessity to resolve the measured voltage and current values into real and imaginary components. The reason is that reliability of the resolving process is critically dependent on maintaining the correct phase relationship between the voltages and currents in the voltage/current measuring sampling system. However, since the testing/sensing circuitry necessarily includes voltage and current transformers, the phase relationship is unavoidably affected. Although the resulting phase deviation is small it has significant effect on the measurements of R, the apparent total impedance, and consequently on the accuracy of the slip and rotor resistance estimates. The phase distortion problem makes it impractical to solve the previously presented equation which expresses "S" (the slip) in terms of R (the apparent total impedance) and $R_3$ (the manufacturer specified stator resistance) because the measurement of R is unreliable and the manufacturer specified value of $R_3$ is given for the ideal case which assumes that the proper phase relationship is maintained.

However, in accordance with a first aspect of the present invention, the slip, rotor resistance and thermal parameters of the motor can be accurately determined by following the below described algorithm which refers to the following, previously presented, equations:

$$R = (|V_{a1}|/|I_{a1}|)(\cos\theta = (V_{a1x}I_{a1x} + V_{a1y}I_{a1y})/|I_{a1}|^2 \quad (1)$$

$$S = R_0/[A(R - R_3) - (R_1 - R_0)] \quad (2) \text{ and}$$

$$R_4 = (R_1 - R_0)S + R_0 \quad (3)$$

For the convenience of the reader, it is repeated herein that:

R, in equation (1), represents the apparent total resistance and is calculated from samples of voltage and current taken by the circuit of FIG. 7, which samples are resolved into rectangular form by means of the microprocessor 56.

S, in equation (2), represents the slip which varies as a function of R (the apparent total resistance) and $R_3$ (the stator resistance). $R_0$, $R_1$ and A are constants that are provided or can be derived from the motor's application data. $R_4$, in equation (3), represents the rotor resistance and its value is easily determined since it only depends on "S" (motor slip) and the constants $R_0$ and $R_1$.

In the final analysis, the invention must accurately determine the temperature in the motor throughout the starting cycle to permit tripping of the motor 36 when and if the temperature exceeds a predetermined magnitude.

As has been explained above, the phase skewing problem makes it impossible to proceed by simply measuring V and I and by solving the equations (1), (2) and (3) to obtain continuously updated estimates of the slip, rotor resistance $R^4$, the $I^2R$ heating effect and, ultimately, the temperature of the motor.

However, a novel initialization scheme of the present invention avoids the phase skewing problem by calculating—rather than accepting the manufacturer specified—value of the stator resistance $R_3$ at start up from a corresponding measurement of $R_3$ which is taken at start up. Consequently, the value $R_3$ contains any offset arising from the phase skewing and since the slip, in equation (2) depends on the difference between R and $R_3$, the effect of the phase skewing is effectively cancelled.

To this end, a sample of the voltage and current phasor is taken at start up and R (start up) calculated. The value of R (start up) is substituted in equation (2) and further advantage is taken of the knowledge that the value of slip at start up is equal to 1. This permits $R_3$ to be calculated and stored for later reference.

Following storage of the calculated stator resistance $R_3$, the invention proceeds by repetitively sampling the voltage and current phasors, calculating serially the values S and $R_4$ for each set of samples, and subsequently, calculating the heating effect and resulting temperature by reference to the rotor thermal model of FIG. 5. Ultimately the motor 36 is deenergized if it is determined that the temperature is about to exceed its maximum permissible value.

Thus, the initialization concept of the present invention solves the problem of the phase distortion since the use of the precalculated value of $R_3$ avoids the phase distortion problem.

A second aspect of the present invention revolves around the recognition that during the first several cycles following start up (about 3½ cycles or 0.05 seconds and not beyond about ½ second) the motor starting currents contain a DC-offset which results from the initial application of the input voltage to the highly inductive circuit of the motor. The DC-offset introduces an erroneous phase shift which result in unusable estimates of R, the apparent total resistance. But the DC current offset decays exponentially and its effect is gone within about 0.05–0.5 seconds. Accordingly, measurement and calculation of the slip and rotor resistance is suspended until the effect is gone and preferably for a duration of about 0.05 to 0.5 seconds following start up. During this interval the heat calculations are carried out that the motor is experiencing a locked rotor condition with hardly any loss in the accuracy of the rotor temperature estimates by assuming that the motor is experiencing a locked rotor condition.

By way of summary, the present invention, therefore, follows the sequence presented below.

1. Initialization - the motor is energized and samples are taken of the voltage and current phasors at start up. The samples of voltage and current phasors are resolved into rectangular form and substituted in equation (1) to solve for R at start up. R (start up) is substituted in equation (2) and the equation is solved for $R_3$, the stator resistance, since it is known that S (slip) is by definition to 1 at start up. The calculated value of $R_3$ is stored for later use.

2. Sampling of the voltage/current phasor is suspended for a period of about 0.05 to 0.5 seconds to permit the DC-offset currents occurring at start up to decay. During this interval, it is assumed that a motor is experiencing a locked motor condition and the $I^2R$ heating effect and resulting temperature rise curve are calculated from the rotor thermal model of FIG. 5 as explained further on.

3. Following the above described brief measurement suspension interval, four samples are taken of the voltage/current phasors during each cycle of the applied power, and each set of samples are processed as follows:

(a) R is calculated from the voltage/current samples.
   (b) R and the previously calculated $R_3$ are substituted in equation (2) to obtain a value of slip S.
   (c) $R_4$, the rotor resistance, is obtained by solving equation (3).
   (d) The $I^2R$ heating effect and the impact of the heating effect on the temperature of the rotor are calculated by reference to the rotor thermal model of FIG. 5.
   (e) If the temperature exceeds the predetermined value set by the manufacturer the motor is tripped. If not, step 3 is repeated during the next cycle of the applied power.

The Equation of the Thermal Limit Curve

Figure 5:
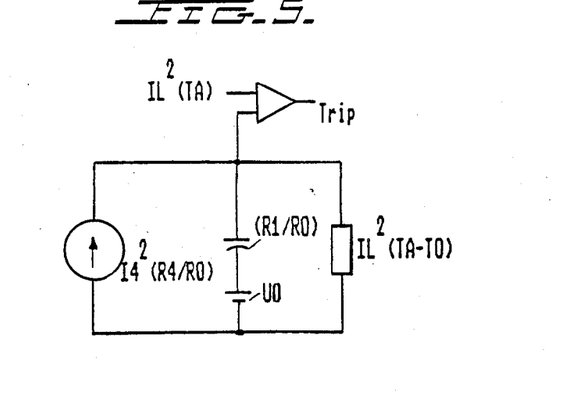
FIG. 5 is a schematic of a rotor thermal model.

The manner in which the rotor thermal model of FIG. 5 is derived and used for calculating the temperature of motor 36 is explained below.

The differential equation for the temperature rise due to the current in any conductor (discounting heat loss) is:

$$I^2R = TC(du/dt) \tag{a}$$

Where:

$I^2R$ represents the heat generated in the conductor and consequently the input watts TC is the thermal capacity (watt-sec/deg. C.) du/dt is the rate of chanqe of temperature (deg. C./sec.)

Equation (a) can be integrated from time zero to time t to find the temperature rise. Assuming that R is constant:

$$u = (1/TC)I^2 rt \quad \text{(b)}$$

Where:
u is the temperature in deg. .C
t is time in seconds
I is current in amps.
r is the electrical resistance of the conductor The temperature can be expressed in perunit and plotted versus current as a time-current characteristic. To do this let I be expressed as a multiple M of a rated current $I_{11}$:

$$I = M I_{11} \quad \text{(c)}$$

and substituting for I in equation (b) obtains:

$$u = (1/TC)(M I_{11})^2 \quad \text{(d)}$$

Dividing equation (d) through by $I_{11}^2 r/TC$:

$$[u(TC)/I_{11}^2 r] = M^2 t \quad \text{(e)}$$

Which can be written simply as:

$$U = M^2 t \quad \text{(f)}$$

Where, since M is in perunit, temperature is in seconds. This shows that an $I^2 t$ curve represents a thermal limit. The curve represents a specific limit temperature and its plot on Log-Log paper is a straight line of negative slope 2.

With current in perunit of rated full load current of the motor, if at locked rotor current is $M_L$ perunit and the limit time is $T_a$ then from equation (f) the limit temperature U is:

$$U_L = M_L^2 T_a \quad \text{(g)}$$

In this equation $T_a$ is the time to heat the conductor to the thermal limit with the conductor initially at ambient, since $U_L$ is the rise over ambient. If, at the same current $M_L$, the thermal limit time is $T_o$ with the conductor initially at operating temperature then from equation (f) the limit temperature is:

$$U_L = M_L^2 T_o + U_o \quad \text{(h)}$$

Where $U_o$ is the operating temperature. Substituting for $U_L$ in terms of $M_L$ and $T_a$ in equation (h) gives:

$$M_L^2 T_a = M_L^2 T_o + U_o \quad \text{(i)}$$

Solving for $U_o$ in terms of $U_1$, $T_a$, and $T_o$ gives:

$$U_o = M_L^2 (T_a - T_o) \quad \text{(j)}$$

Consequently the thermal curves specified with the initial conditions at ambient and at operating temperature determine the operating temperature. Also the operating temperature can be plotted along with the other thermal limit curves.

The perunit $I^2 t$ curves discussed are the motor thermal limit curves. It will be shown that the specific values $M_L$, $T_a$, and $T_o$ are the parameters which define the thermal model.

The Thermal Algorithm

The differential equation accounting for heat loss can be expressed in perunit $I^2 t$ units as:

$$dU/dt = M^2 - (1/q)U \quad \text{(k)}$$

Where q is the thermal time constant in seconds and equals the thermal capacitance times the thermal resistance. Euler's method is used to express the derivative as a finite difference:

$$(U - U_o)/T = M^2 - (1/q)U_o \quad \text{(l)}$$

Where U is the state after the discrete time interval T and Uo is the present state of temperature. Solving equation (1) for the next state U in terms of the present state Uo gives:

$$U = M^2 T + (1 - T/q)U_o \quad \text{(m)}$$

The state equation is the basis for the thermal algorithm and the procedure executed by the processor 56 is:

For N=1 to (trip) do:

$U = M^2 T + (1 - T/q)U_o$ Calc. Next value
$U_o = U$. Update present state
Next N. Repeat process The differential equation for heat rise in a conductor expressed as a difference equation forms the basis of the thermal algorithm. The algorithm, executed by the processor, calculates the temperature in real time. The calculation is accurate because the time increment is small compared to the large thermal time constant.

The Rotor Protection Algorithm

Equation (m) is unsuitable in a rotor algorithm because rotor heating is slip dependent as has been explained.

To remedy this situation, rotor resistance can be expressed in terms of slip as:

$$Rr = (R_1 - R_0)S - R0 \quad \text{(n)}$$

(compare to equation (3) of page 18)
where:
$R_1$ is the rotor resistance at locked rotor
R0 is the rotor resistance at rated slip
R0 is a perunit resistance numerically equal to rated slip and $R_1$ can be calculated from the perunit values of locked rotor torque and current. The temperature equation including the slip dependent rotor resistance Rr is:

$$U = M^2 (Rr/R0)T + (1 - T/q)(R1/R0)U_o \quad \text{(o)}$$

The previously described digital filter technique which is used to sample the voltage/current phasor and to calculate therefrom the apparent total resistance, motor slip, and rotor resistance permits the last equation (o) to be solved repetitively for the present temperature of the motor, namely parameter U in equation (o) above.

Although the thermal models of FIG. 5 are actually state equations executed by the processor 56, they can be visualized as electrical analog circuits which behave according to the same form of the equation where:
- the thermal capacitance and thermal resistance are direct analogs;
- the analog of the heat source is a constant current generator having an input numerically equal to the watts energy generated by the heat source; and
- the analog of temperature rise over ambient is voltage.

In the rotor model:

IL -Represents the perunit locked rotor current $T_a$-Represents the time to reach thermal limit starting from ambient at locked rotor current IL To -Represents the time to reach thermal limit starting from operating temperature at locked rotor current IL R1 -Is the perunit rotor resistance at locked rotor calculated from locked rotor current and torque)

R0 -Is the perunit rotor resistance at rated slip (equals rated slip).

In sum, by means of the rotor thermal model of FIG. 5, the initialization scheme, the repetitive measurements of the motor's voltage and current phasors, and the solving of the equations (1), (2) and (3) (page 18 the present invention permits the temperature of the motor to be calculated dynamically and throughout the starting, or restarting of the motor. The highly accurate motor temperature estimates result in improvements in controlling the tripping of motor 36.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A system for determining rotor resistance values of a an induction motor from an input voltage and an input current applied to said induction motor, said system comprising:
   first means for repetitively sampling the input voltage and input current of said induction motor to obtain a plurality of voltage and current samples including at least one pair of voltage and current samples taken at start up of said induction motor;
   second means, responsive to said first means, for calculating from said voltage and current samples instantaneous total apparent resistance values including an initial apparent total resistance value obtained at said start up;
   third means, responsive to said second means, for deriving from said initial apparent total resistance value a calculated stator resistance;
   fourth means, responsive to said first second and third means, for repetitively calculating instantaneous slip values from said instantaneous apparent total resistance values and from said calculated stator resistance;
   fifth means, responsive to said second third and fourth means for calculating instantaneous rotor resistance values from said instantaneous slip values
   sixth means for calculating, from said instantaneous rotor resistance values and said current input, the quantity of heat generated and the temperature prevailing in said rotor;
   seventh means for tripping said motor when said temperature reaches a predetermined value, said seventh means including means for repetitively calculating an instantaneous temperature value;
   a microprocessor and an associated control program, said microprocessor and control program comprising said second, third, fourth, fifth and sixth means; and
   an interface circuit for interfacing said microprocessor to said motor.

2. The system of claim 1, wherein said motor is a three phase induction motor.

3. The system of claim 1, wherein said interface circuit includes voltage and current transformer means for being coupled to the motor for sensing said input voltage and current applied to said motor.

4. The system of claim 3, wherein said interface circuit includes low pass filter means coupled to the transfer means for filtering outputs received from said transformer means.

5. The system of claim 4, wherein said interface circuit includes a multiplexer for receiving a plurality of sampled signals derived from said voltage and current transformers and for individually and sequentially selecting said sampled signals for presentation to another circuit.

6. The system of claim 5, wherein said interface circuit includes a programmable gain amplifier coupled to and effective for amplifying signals received from said multiplexer.

7. The system of claim 5, wherein said interface circuit includes an analog to digital converter for converting said sampled signals to digital quantities.

8. The system of claim 1, further comprising means for suspending said calculation of said instantaneous apparent total resistance values during a predetermined interval beginning at said start up.

9. The system of claim 8, wherein said predetermined interval endures for about 3½ cycles of said input voltage.

10. The system of claim 1, wherein said control program comprises a rotor thermal model effective for generating therewith estimates of said temperature during starting of said motor.

11. The system of claim 10, wherein said rotor thermal model is further effective for obtaining said estimates of temperature based on an input specifying the temperature of said motor when said motor is started.

12. A method for determining rotor resistance values of a three phase induction motor from an input voltage and an input current applied to said three phase induction motor, said method comprising the steps of:
   repetitively sampling the input voltage and input current of said three phase induction motor to obtain a plurality of voltage and current samples including at least one pair of voltage and current samples taken at start up of said three phase induction motor;
   calculating from said voltage and current samples instantaneous total apparent resistance values including an initial apparent total resistance value obtained at said start up;
   deriving from said initial apparent total resistance value a calculated stator resistance;

repetitively calculating instantaneous slip values for said motor from said instantaneous apparent total resistance values and from said calculated stator resistance;

calculating instantaneous rotor resistance values from said instantaneous slip values; and repetitively obtaining instantaneous estimates of the temperature prevailing in said motor and tripping said motor when said temperature reaches a predetermined value.

13. The method of claim 12, comprising obtaining at least four samples each of said input voltage and current during each cycle thereof.

14. The method of claim 13, further comprising suspending said calculation of said instantaneous total resistance values during a predetermined interval beginning at said start up.

15. The method of claim 14, wherein said predetermined interval endures for about 3½ cycles of said input voltage.

16. The method of claim 14, wherein said predetermined interval endures for about 0.05 to 0.5 seconds.

17. The method of claim 16, further comprising calculating, from said instantaneous rotor resistance values and said input current, the rate at which heat is generated in said motor.

* * * * *